United States Patent
Hellring et al.

(10) Patent No.: US 8,088,323 B2
(45) Date of Patent: Jan. 3, 2012

(54) PROCESS OF ELECTROSPINNING ORGANIC-INORGANIC FIBERS

(75) Inventors: Stuart D. Hellring, Pittsburgh, PA (US); Kaliappa G. Ragunathan, Gibsonia, PA (US); Kenneth J. Balog, Tarentum, PA (US); Hong Li, Sewickley, PA (US); Robert A. Montague, Shelby, NC (US)

(73) Assignee: PPG Industries Ohio, Inc., Cleveland, OH (US)

( * ) Notice: Subject to any disclaimer, the term of this patent is extended or adjusted under 35 U.S.C. 154(b) by 1121 days.

(21) Appl. No.: 11/679,345

(22) Filed: Feb. 27, 2007

(65) Prior Publication Data

US 2008/0207798 A1    Aug. 28, 2008

(51) Int. Cl.
*D06M 10/00*    (2006.01)
*H05B 7/00*    (2006.01)
(52) U.S. Cl. ............................................. 264/465
(58) Field of Classification Search .................... 264/465
See application file for complete search history.

(56) References Cited

U.S. PATENT DOCUMENTS

| | | | |
|---|---|---|---|
| 6,265,333 B1 | 7/2001 | Dzenis et al. | 442/346 |
| 6,713,011 B2 | 3/2004 | Chu et al. | 264/465 |
| 7,105,124 B2 | 9/2006 | Choi | 264/465 |
| 2003/0039812 A1 | 2/2003 | Tsai et al. | 428/210 |
| 2003/0168756 A1* | 9/2003 | Balkus et al. | 264/10 |
| 2005/0235619 A1 | 10/2005 | Heinz et al. | |
| 2006/0024483 A1 | 2/2006 | Koch et al. | 428/292.1 |
| 2006/0226580 A1* | 10/2006 | Xia et al. | 264/465 |
| 2007/0018361 A1 | 1/2007 | Xu | |
| 2007/0144124 A1 | 6/2007 | Schewe et al. | |
| 2007/0148471 A1* | 6/2007 | Rukavina et al. | 428/423.1 |
| 2008/0187996 A1* | 8/2008 | Baca et al. | 435/396 |
| 2008/0207076 A1 | 8/2008 | Jirsak et al. | |

FOREIGN PATENT DOCUMENTS

| | | |
|---|---|---|
| JP | 09-194788 | 7/1997 |
| JP | 2001-036214 | 2/2001 |
| JP | 2004-277512 | 10/2004 |
| WO | WO 92/22191 | 12/1992 |
| WO | WO 94/28054 | 12/1994 |

OTHER PUBLICATIONS

A. C. Patel et al., "Electrospinning of Porous Silica Nanofibers Containing Silver Nanoparticles for Catalytic Applications", Chem. Mater. 2007, 19, 1231-1238.
Yen Wei et al., "A Fast Convenient Method to Prepare Hybrid Sol-Gel Materials with Low Volume-Shrinkages", Journal of Sol-Gel Science and Technology 7, 191-201 (1996).
Yen Wei et al., "Synthesis of Water-Soluble Polyacrylics Modified Silica Sol-Gel Materials", Chem. Mater. 1994, 6, 1737-1741.
Electrospinning of Nanofibers: Reinventing the Wheel? by Dan Li and Younan Xia; *Advanced Materials* 2004, 16, No. 14, Jul. 19, 1151-1169.
A review on polymer nanofibers by electrospinning and their applications in nanocomposites by Zheng-Ming Huang, Y.-Z. Zhang, M. Kotaki, S. Ramakrishna; *Composites Science and Technology* 63 (2003) 2223-2253.

(Continued)

*Primary Examiner* — Leo B Tentoni
(74) *Attorney, Agent, or Firm* — Andrew Siminerio

(57) ABSTRACT

Organic-inorganic hybrid fibers and methods for the preparation of such fibers are disclosed.

9 Claims, 1 Drawing Sheet

OTHER PUBLICATIONS

Processing and Structure Relationships in Electrospinning of Ceramic Fiber Systems by Wolfgang Sigmund, Junhan Yuh, Hyun Park, Vasana Maneeratana, Georgios Pyrgiotakis, Amit Daga, Joshua Taylor, and Juan C. Nino; *Journal of the American Ceramic Society* 89 [2] 395-407 (2006).

In Situ Photo-Cross-Linking of Cinnamate Functionalized Poly(methyl methacrylate-co-2-hydroxyethyl acrylate) Fibers during Electrospinning by Pankaj Gupta, Scott R. Trenor, Timothy E. Long, and Garth L. Wilkes; *Macromolecules* 2004, 37, 9211-9218.

Mechanical Properties of Composites Using Ultrafine Electrospun Fibers by Jong-Sang Kim and Darrell H. Reneker; *Polymer Composites*, Feb. 1999, vol. 20, No. 1, 124-131.

Transparent Nanocomposites with Ultrathin, Electrospun Nylon-4,6 Fiber Reinforcement by Michel M. Bergshoef and G. Julius Vancso; *Advanced Materials* 1999, 11, No. 16, 1362-1365.

Electrospinning of Nanofibers by Thandavamoorthy Subbiah, G. S. Bhat, R. W. Tock, S. Parameswaran, S. S. Ramkumar; Journal of Applied Polymer Science, vol. 96, 557-569 (2005).

Polybenzimidazole Nanofiber Produced by Electrospinning by Jong-Sang Kim and Darrell H. Reneker; *Polymer Engineering and Science*, May 1999, vol. 39, No. 5, 849-854.

United States Patent and Trademark Office, Office Action, U.S. Appl. No. 11/610,726, mailed Mar. 30, 2010.

United States Patent and Trademark Office, Office Action, U.S. Appl. No. 11/610,726, mailed Nov. 10, 2010.

\* cited by examiner

PROCESS OF ELECTROSPINNING ORGANIC-INORGANIC FIBERS

FIELD OF THE INVENTION

The present invention relates to novel organic-inorganic hybrid fibers and to methods for preparing the hybrid fibers and to composite articles comprising a polymer matrix and incorporated within the matrix the organic-inorganic hybrid fibers.

BACKGROUND OF THE INVENTION

Glass fiber-reinforced polymeric articles are well known for use in the circuit board industry. The articles form a support and dielectric layer for fine tracings of copper that form the electrical circuit. So-called circuit board blanks are prepared by laminating a thin copper foil to one or both major surfaces of the fiber glass-reinforced polymeric substrates under heat and pressure. Alternatively, the copper foil is placed on a fiber glass non-woven mat impregnated with a partially cured polymer, called a prepeg, followed by molding under high temperature and pressure. A suitable mask is applied to the copper surfaces of the blank to define the printed circuit configuration. The masked foil is then subjected to a chemical etching process to dissolve unmasked portions of the copper foil. The retained portions of the foil serve as the electrical contact paths of the finished circuit board.

The trend in recent years is towards miniaturization of electronic equipment and increased processing speed. This has resulted in finer circuits and increased wiring densities. As the wiring densities increase, the amount of heat generated also increases. The generation of heat is problematic for both the circuit board blank and the finished circuit board. The rate of thermal expansion of the fiber glass is very different from the polymeric matrix leading to distortion in the copper overlayer. This can create adhesion and short-circuiting problems.

SUMMARY OF THE INVENTION

The present invention provides an organic-inorganic hybrid fiber comprising:

(a) an organic polymer phase and (b) an inorganic polymeric phase, where (a) and (b) are intermixed and reacted with one another.

The hybrid fiber can be formed by an electrospinning process in which an electrically conductive solution of an organic polymer and an inorganic oligomer or a precursor thereof is spun in the presence of an electric field between a spinneret and a ground source wherein the organic and inorganic phases intermix and react with one another.

The hybrid fibers can be used to reinforce polymeric materials such as those associated with circuit board manufacture. Because of the inorganic component, the fibers provide dimensional stability to the composite article, and the organic component makes the coefficient of thermal expansion more like that of the polymeric matrix resulting in less distortion of the copper overlayer. In addition, the electrospinning process can produce fibers with nano dimensions that further minimize distortion.

DETAILED DESCRIPTION OF THE INVENTION

For purposes of the following detailed description, it is to be understood that the invention may assume various alternative variations and step sequences, except where expressly specified to the contrary. Moreover, other than in any operating examples, or where otherwise indicated, all numbers expressing, for example, quantities of ingredients used in the specification and claims are to be understood as being modified in all instances by the term "about". Accordingly, unless indicated to the contrary, the numerical parameters set forth in the following specification and attached claims are approximations that may vary depending upon the desired properties to be obtained by the present invention. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard variation found in their respective testing measurements.

Also, it should be understood that any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10.

In this application, the use of the singular includes the plural and plural encompasses singular, unless specifically stated otherwise. In addition, in this application, the use of "or" means "and/or" unless specifically stated otherwise, even though "and/or" may be explicitly used in certain instances.

The term "polymer" is also meant to include copolymer and oligomer. The term "acrylic" is meant to include methacrylic and is depicted by (meth)acrylic.

Figure 1:
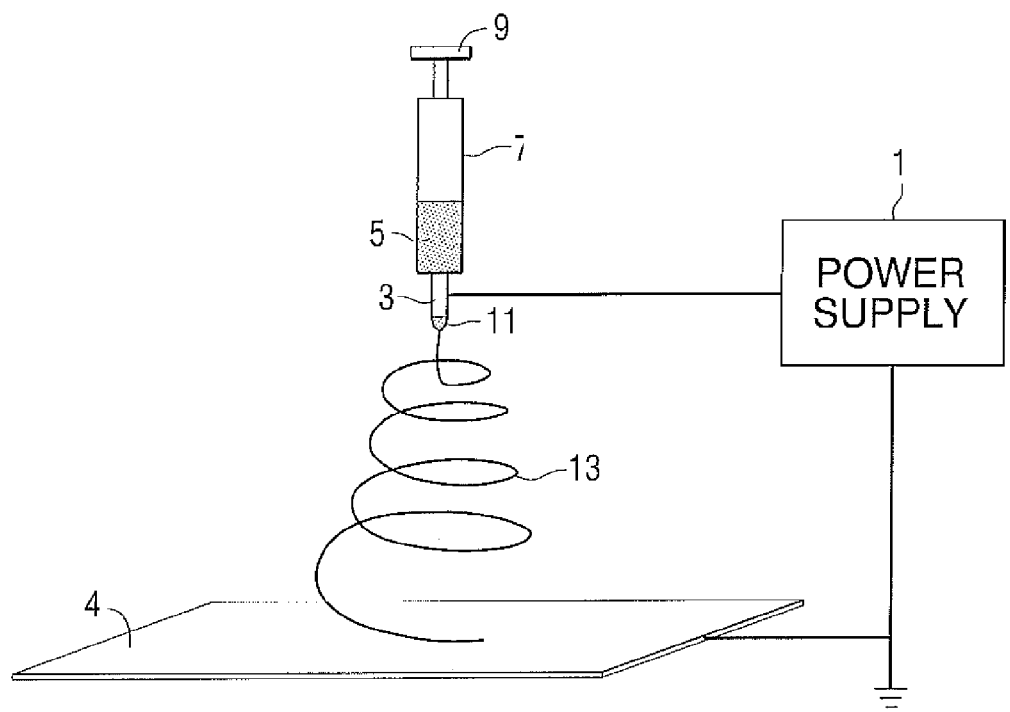
FIG. 1 depicts a basic electrospinning system.
Figure 2:
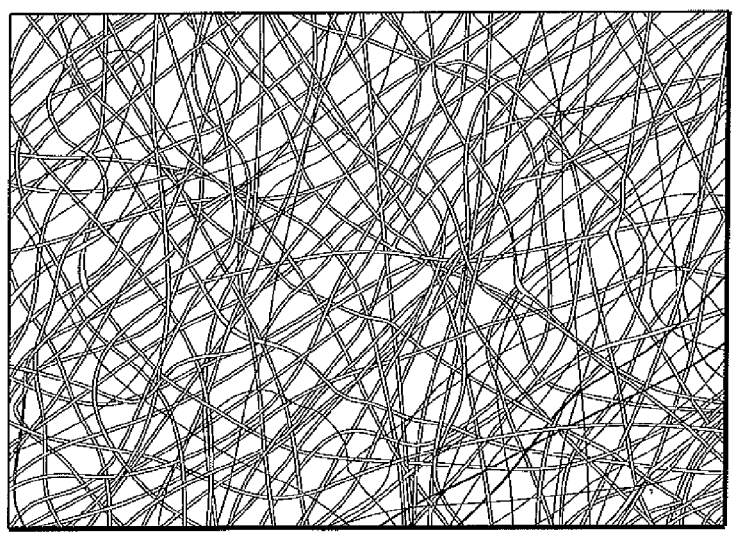
FIG. 2 simulates a scanning electron microscopic (SCM) image of a non-woven mat.

With reference to FIG. 1, the electrospinning system consists of three major components, a power supply 1, a spinneret 3 and an electrically grounded collector 4. Direct current or alternating current may be used in the electrospinning process. A hybrid polymer solution 5 is contained in a syringe 7. A syringe pump 9 forces the solution through the spinneret 3 at a controlled rate. A drop of the solution forms at the tip of the needle 11. Upon application of a voltage, typically from 5 to 30 kilovolts (kV), the drop becomes electrically charged. Consequently, the drop experiences electrostatic repulsion between the surface charges and the forces exerted by the external electric field. These electrical forces will distort the drop and will eventually overcome the surface tension of the polymer solution resulting in the ejection of a liquid jet 13 from the tip of the needle 11. Because of its charge, the jet is drawn downward to the grounded collector 4. During its travel towards the collector 4, the jet 13 undergoes a stretching action leading to the formation of a thin fiber. The continuously formed charged fiber is deposited on the collector 4 as a random oriented non-woven mat as generally shown in FIG. 2. Alternatively, the electrospun fiber can be collected in an ordered or aligned pattern. This may be accomplished by using a collector consisting of two conductive strips separated by a void gap up to several centimeters. Electrospun fibers can be uniaxially aligned over long length scales during the spinning process. The introduction of an insulating gap to the collector alters the configuration of electrostatic forces acting on the fibers spanning across the gap. Under the action of such electrostatic forces in opposite directions, the charged fibers are stretched to align themselves perpendicular to each edge of the gap, even though abrupt changes in the moving direction are required. The electrostatic repulsions between deposited nanofibers can further enhance the degree of alignment. See Li and Xia, "Advanced Materials", 2004, 16, No. 14, Jul. 19, pages 1162-1163.

The organic polymers of the present invention can be acrylic polymers. As used herein, the term "acrylic" polymer refers to those polymers that are well known to those skilled in the art which results in the polymerization of one or more ethylenically unsaturated polymerizable materials. (Meth) acrylic polymers suitable for use in the present invention can be made by any of a wide variety of methods as will be understood by those skilled in the art. The (meth)acrylic polymers are made by addition polymerization of unsaturated polymerizable materials that contain silane groups, carboxyl groups, hydroxyl groups and optionally a nitrogen-containing group. Examples of silane groups include, without limitation, groups that have the structure Si—$X_n$ (wherein n is an integer having a value ranging from 1 to 3 and X is selected from chlorine, alkoxy esters, and/or acyloxy esters). Such groups hydrolyze in the presence of water including moisture in the air to form silanol groups that condense to form —Si—O—Si—groups.

Examples of silane-containing ethylenically unsaturated polymerizable materials, suitable for use in preparing such (meth)acrylic polymers include, without limitation, ethylenically unsaturated alkoxy silanes and ethylenically unsaturated acyloxy silanes, more specific examples of which include vinyl silanes such as vinyl trimethoxysilane, acrylatoalkoxysilanes, such as gamma-acryloxypropyl trimethoxysilane and gamma-acryloxypropyl triethoxysilane, and methacrylatoalkoxysilanes, such as gamma-methacryloxypropyl trimethoxysilane, gamma-methacryloxypropyl triethoxysilane and gamma-methacryloxypropyl tris-(2-methoxyethoxy)silane; acyloxysilanes, including, for example, acrylato acetoxysilanes, methacrylato acetoxysilanes and ethylenically unsaturated acetoxysilanes, such as acrylatopropyl triacetoxysilane and methacrylatopropyl triacetoxysilane. In certain embodiments, it may be desirable to utilize monomers that, upon addition polymerization, will result in a (meth)acrylic polymer in which the Si atoms of the resulting hydrolyzable silyl groups are separated by at least two atoms from the backbone of the polymer. Preferred monomers are (meth)acryloxyalkylpolyalkoxy silane, particularly (meth) acryloxyalkyltrialkoxy silane in which the alkyl group contains from 2 to 3 carbon atoms and the alkoxy groups contain from 1 to 2 carbon atoms.

In certain embodiments, the amount of the silane-containing ethylenically unsaturated polymerizable material used in the total monomer mixture is chosen so as to result in the production of a (meth)acrylic polymer comprising silane groups that contain from 0.2 to 20, preferably 5 to 10 percent by weight, silicon, based on the weight of the total monomer combination used in preparing the (meth)acrylic polymer.

The (meth)acrylic polymers suitable for use in the present invention are typically the reaction product of one or more of the aforementioned silane-containing ethylenically unsaturated polymerizable materials and preferably an ethylenically unsaturated polymerizable material that comprises carboxyl such as carboxylic acid groups or an anhydride thereof. Examples of suitable ethylenically unsaturated acids and/or anhydrides thereof include, without limitation, acrylic acid, methacrylic acid, itaconic acid, crotonic acid, maleic acid, maleic anhydride, citraconic anhydride, itaconic anhydride, ethylenically unsaturated sulfonic acids and/or anhydrides such as sulfoethyl methacrylate, and half esters of maleic and fumaric acids, such as butyl hydrogen maleate and ethyl hydrogen fumarate in which one carboxyl group is esterified with an alcohol.

Examples of other polymerizable ethylenically unsaturated monomers to introduce carboxyl functionality are alkyl including cycloalkyl and aryl (meth)acrylates containing from 1 to 12 carbon atoms in the alkyl group and from 6 to 12 carbon atoms in the aryl group. Specific examples of such monomers include methyl methacrylate, n-butyl methacrylate, n-butyl acrylate, 2-ethylhexyl methacrylate, cyclohexyl methacrylate and phenyl methacrylate.

The amount of the polymerizable carboxyl-containing ethylenically unsaturated monomers is preferably sufficient to provide a carboxyl content of up to 55, preferably 15.0 to 45.0 percent by weight based on the weight of the total monomer combination used to prepare the (meth)acrylic polymer. Preferably, at least a portion of the carboxyl groups are derived from a carboxylic acid such that the acid value of the polymer is within the range of 20 to 80, preferably 30 to 70, on a 100% resin solids basis.

The (meth)acrylic polymer used in the invention also preferably contains hydroxyl functionality typically achieved by using a hydroxyl functional ethylenically unsaturated polymerizable monomer. Examples of such materials include hydroxyalkyl esters of (meth)acrylic acids having from 2 to 4 carbon atoms in the hydroxyalkyl group. Specific examples include hydroxyethyl(meth)acrylate, hydroxypropyl(meth) acrylate and 4-hydroxybutyl(meth)acrylate. The amount of the hydroxy functional ethylenically unsaturated monomer is sufficient to provide a hydroxyl content of up to 6.5 such as 0.5 to 6.5, preferably 1 to 4 percent by weight based on the weight of the total monomer combination used to prepare the (meth)acrylic polymer.

The (meth)acrylic polymer optionally contains nitrogen functionality introduced from a nitrogen-containing ethylenically unsaturated monomer. Examples of nitrogen functionality are amines, amides, ureas, imidazoles and pyrrolidones. Examples of suitable N-containing ethylenically unsaturated monomers are: amino-functional ethylenically unsaturated polymerizable materials that include, without limitation, p-dimethylamino ethyl styrene, t-butylaminoethyl(meth) acrylate, dimethylaminoethyl(meth)acrylate, diethylaminoethyl(meth)acrylate, dimethylaminopropyl(meth)acrylate and dimethylaminopropyl(meth)acrylamide; amido-functional ethylenically unsaturated materials that include acrylamide, methacrylamide, n-methyl acrylamide and n-ethyl (meth)acrylamide; urea functional ethylenically unsaturated monomers that include methacrylamidoethylethylene urea.

If used, the amount of the nitrogen-containing ethylenically unsaturated monomer is sufficient to provide nitrogen content of up to 5 such as from 0.2 to 5.0, preferably from 0.4 to 2.5 percent by weight based on weight of a total monomer combination used in preparing the (meth)acrylic polymer.

Besides the polymerizable monomers mentioned above, other polymerizable ethylenically unsaturated monomers that may be used to prepare the (meth)acrylic polymer. Examples of such monomers include poly(meth)acrylates such as ethylene glycol di(meth)acrylate, trimethylolpropane tri(meth)acrylate, ditrimethylolpropane tetraacrylate; aromatic vinyl monomers such as styrene, vinyl toluene and alpha-methylstyrene; monoolefinic and diolefinic hydrocarbons, unsaturated esters of organic and inorganic acids and esters of unsaturated acids and nitriles. Examples of such monomers include 1,3-butadiene, acrylonitrile, vinyl butyrate, vinyl acetate, allyl chloride, divinyl benzene, diallyl itaconate, triallyl cyanurate as well as mixtures thereof. The polyfunctional monomers, such as the polyacrylates, if present, are typically used in amounts up to 20 percent by weight. The monofunctional monomers, if present, are used in amount up to 70 percent by weight; the percentage being based on weight of the total monomer combination used to prepare the (meth)acrylic polymer.

The (meth)acrylic polymer is typically formed by solution polymerization of the ethylenically unsaturated polymerizable monomers in the presence of a polymerization initiator such as azo compounds, such as alpha, alpha'-azobis(isobutyronitrile), 2,2'-azobis(methylbutyronitrile) and 2,2'-azobis (2,4-dimethylvaleronitrile); peroxides, such as benzoyl peroxide, cumene hydroperoxide and t-amylperoxy-2-ethylhexanoate; tertiary butyl peracetate; tertiary butyl perbenzoate; isopropyl percarbonate; butyl isopropyl peroxy carbonate; and similar compounds. The quantity of initiator employed can be varied considerably; however, in most instances, it is desirable to utilize from 0.1 to 10 percent by weight of initiator based on the total weight of copolymerizable monomers employed. A chain modifying agent or chain transfer agent may be added to the polymerization mixture. The mercaptans, such as dodecyl mercaptan, tertiary dodecyl mercaptan, octyl mercaptan, hexyl mercaptan and the mercaptoalkyl trialkoxysi lanes such as 3-mercaptopropyl trimethoxysi lane may be used for this purpose as well as other chain transfer agents such as cyclopentadiene, allyl acetate, allyl carbamate, and mercaptoethanol.

The polymerization reaction for the mixture of monomers to prepare the acrylic polymer can be carried out in an organic solvent medium utilizing conventional solution polymerization procedures which are well known in the addition polymer art as illustrated with particularity in, for example, U.S. Pat. Nos. 2,978,437; 3,079,434 and 3,307,963. Organic solvents that may be utilized in the polymerization of the monomers include virtually any of the organic solvents often employed in preparing acrylic or vinyl polymers such as, for example, alcohols, ketones, aromatic hydrocarbons or mixtures thereof. Illustrative of organic solvents of the above type which may be employed are alcohols such as lower alkanols containing 2 to 4 carbon atoms including ethanol, propanol, isopropanol, and butanol; ether alcohols such as ethylene glycol monoethyl ether, ethylene glycol monobutyl ether, propylene glycol monomethyl ether, and dipropylene glycol monoethyl ether; ketones such as methyl ethyl ketone, methyl N-butyl ketone, and methyl isobutyl ketone; esters such as butyl acetate; and aromatic hydrocarbons such as xylene, toluene, and naphtha.

In certain embodiments, the polymerization of the ethylenically unsaturated components is conducted at from 0°C. to 150° C., such as from 50° C. to 150° C., or, in some cases, from 80° C. to 120° C.

The polymer prepared as described above is usually dissolved in solvent and typically has a resin solids content of about 15 to 80, preferably 20 to 60 percent by weight based on total solution weight. The molecular weight of the polymer typically ranges between 3,000 to 1,000,000, preferably 5,000 to 100,000 as determined by gel permeation chromatography using a polystyrene standard.

The inorganic polymeric phase of the fibers can be derived from an inorganic polymer or can be derived from a precursor that forms the inorganic polymer in situ. For example, the inorganic polymeric phase can be derived from a polymeric metal oxide that contains alkoxide groups and optionally hydroxyl groups. Preferably, the alkoxide groups contain 1 to 4 carbon atoms, such as methoxide and ethoxide. Examples of such polymeric metal oxides are polyalkylsilicate of the following structure:

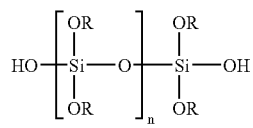

where R is alkyl containing from 1 to 4, preferably 1 to 2 carbon atoms, and n=3-10.

Examples of precursors of inorganic polymer are metals having a hydrolyzable leaving group and are capable of forming an inorganic polymer by hydrolysis and condensation. Examples of suitable metals are electropositive metals that can replace the hydrogen of an acid and form bases with the hydroxyl radical. Preferred metals are silicon, titanium, aluminum and zirconium. Suitable precursors are $MX_3$ and $MX_4$ where M is the metal and X is halogen, alkoxy, aryloxy, carboxy or an $NR_2$ group in which R is hydrogen and/or alkyl and/or aryl. Alkoxy groups containing from 1 to 4, preferably 1 to 2 carbon atoms are preferred. Also, other metals may be used particularly in combination with the preferred metals. Examples of such metals are boron, indium, tin, tantalum, lanthanum, iron, copper, yttrium, germanium, barium and magnesium. Preferred precursors are tetraethyl orthosilicate, tetramethyl orthosilicate, alkoxides of metals such as titanium and zirconium in which the alkoxide group contains from 1 to 4 carbon atoms. Examples include titanium, tetraisopropoxide, zirconium tetra-n-butoxide and aluminum tri-sec-butoxide.

For the electrospinning application, the organic polymers such as described above can be mixed with the polymeric metal oxides and/or with the precursor thereof such as the metal alkoxides and water to initiate hydrolysis and polymerization of the metal alkoxides and hydrolysis and further polymerization of the polymeric metal oxides and various crosslinking reactions. The crosslinking reactions are those associated with the acrylic silane polymer and with the hydrolysis products of the metal alkoxides and/or the polymeric metal alkoxides. The various reactions that are believed to be occurring are the silane groups associated with the acrylic silane reacting with themselves and with the metal hydroxide groups that are the result of the hydrolysis products of the metal alkoxide and polymeric metal alkoxide. Also, the metal hydroxide groups can react with themselves. These various reactions that are occurring result in the formation of a fiber having an organic polymeric phase and an inorganic polymeric phase that are intermixed and reacted with one another.

The relative amounts of the organic polymeric phase and the inorganic polymeric phase can vary widely and depends somewhat on the application to which the fibers are to be used. The organic polymeric phase can, for example, constitute from 5 to 95, such as 10 to 90, and 30 to 70 percent by weight of the fiber, with the inorganic polymeric phase constituting from 5 to 95, such as 10 to 90, and 30 to 70 percent by weight of the fiber; the percentages by weight being based on total fiber weight.

As mentioned above, a solution of the organic polymer and inorganic polymeric metal alkoxide and/or the metal alkoxide such as described above is mixed with water to initiate the crosslinking reaction and to build viscosity necessary for fiber formation. Typically about 5 to 20, preferably 10 to 15 percent by weight water is added to the solution with the percentage by weight being based on total weight of the solution and the water. Preferably a base such as a water-soluble organic amine is added to the water solution to catalyze the crosslinking reaction. Optionally a thickener such as polyvinyl pyrrolidone, polyvinyl alcohol, polyvinyl acetate, polyamides and/or a cellulosic thickener can be added to the electrospinning formulation to better control its viscoelastic behavior. If used, the thickener is present in amounts no greater than 20 percent by weight, typically from 1 to 6 percent by weight based on weight of the polymer solution.

The electrospinning formulation prepared as described above is then stored to permit the viscosity to build to the crosslinking reaction. When the viscosity is sufficiently high but short of gelation, the formulation is subjected to the electrospinning process as described above.

Typically, the viscosity should be at least 5 and less than 2,000, usually less than 1,000, such as preferably within the range of 50 to 250 centistokes for the electrospinning process. A Bubble Viscometer according to ASTM D-1544 determines the viscosity. The time for storing the electrospinning formulation will depend on a number of factors such as temperature, crosslinking functionality and catalyst. Typically, the electrospinning formulation will be stored for as low as one minute up to two hours.

When subject to the electrospinning process, the formulations described above will produce fibers having a diameter of up to 10,000 nanometers, more typically 5000 nanometers or less, such as from 5 to 5000 nanometers, or within the range of 50 to 1200 nanometers, such as 50 to 700 nanometers. The fibers also can have a ribbon configuration, and in this case, the diameter is intended to mean the largest dimension of the fiber. Typically, the width of the ribbon-shaped fibers is up to 5000, such as 500 to 5000 nanometers, and the thickness up to 200, such as 5 to 200 nanometers.

The hybrid fibers of the present invention can be used as reinforcement for polymeric materials in which the fibers are incorporated within a polymeric matrix to form the composite article. The fibers can be assembled in the form of a non-woven mat and impregnated with the starting materials used to form the polymer. The impregnated mat could then be molded under heat and pressure to form the composite article. Alternatively, chopped hybrid fibers and polymer starting materials could be injected into a mold with the chopped fibers being dispersed throughout the starting materials and then molded under heat and pressure to form the composite article. Typical end uses for reinforced polymeric material are circuit board blanks and the circuit boards themselves.

The polymeric matrix material could be a thermoplastic material such as a polyolefin, for example, polypropylene or polybutadiene, or a thermosetting material such as that derived from an epoxy resin or an unsaturated polyester resin.

The hybrid fiber content of the composite article can vary widely depending somewhat on the application of the composite article. Fiber contents of 0.1 to 95 percent by weight based on total weight of the composite article can be used. Lower ranges of from 0.1 to 5 percent by weight and higher ranges of 10 to 80 percent by weight are typical.

The following examples are presented to demonstrate the general principles of the invention. However, the invention should not be considered as limited to the specific examples presented. All parts are by weight unless otherwise indicated.

EXAMPLE A

With reference to Table 1 below, a reaction flask was equipped with a stirrer, thermocouple, nitrogen inlet and a condenser. Charge A was then added and stirred with heat to reflux temperature (75° C.-80° C.) under nitrogen atmosphere. To the refluxing ethanol, Charge B and Charge C were simultaneously added over three hours. The reaction mixture was held at reflux condition for two hours. Charge D was then added over a period of 30 minutes. The reaction mixture was held at reflux condition for two hours and subsequently cooled to 30° C.

TABLE 1

|  | Example A |
|---|---|
| Charge A (weight in grams) |  |
| Ethanol SDA 40B[1] | 360.1 |
| Charge B (weight in grams) |  |
| Methyl Methacrylate | 12.8 |
| Acrylic acid | 8.7 |
| Silquest A-174[2] | 101.4 |
| 2-hydroxylethylmethacrylate | 14.5 |
| n-Butyl acrylate | 0.2 |
| Acrylamide | 7.2 |
| Ethanol SDA 40B | 155.7 |
| Charge C (weight in grams) |  |
| Vazo 67[3] | 6.1 |
| Ethanol SDA 40B | 76.7 |
| Charge D (weight in grams) |  |
| Vazo 67 | 1.5 |
| Ethanol SDA 40B | 9.1 |
| % Solids | 17.9 |
| Acid value (100% resin solids) | 51.96 |

[1]Denatured ethyl alcohol, 200 proof, available from Archer Daniel Midland Co.
[2]gamma-methacryloxypropyltrimethoxysilane, available from GE silicones.
[3]2,2'-azo bis(2-methyl butyronitrile), available from E.I. duPont de Nemours & Co., Inc.

EXAMPLES 1-4

Example 1

The acrylic-silane resin solution from Example A (10 grams) was blended with Ethyl Polysilicate (Silbond® 40, 3 grams), polyvinylpyrrolidone (0.1 grams) and water (1.5 grams). The formulation was stored at room temperature for about 7 hours. A portion of the formulation was loaded into a 10 ml syringe and delivered via a syringe pump at a rate of 0.8 milliliters per hour to a spinneret (stainless steel tube 1/16-inch outer diameter and 0.010-inch internal diameter). This tube was connected to a grounding aluminum collector via a high voltage source to which about 21 kV potential was applied. The delivery tube and collector were encased in a box that allowed nitrogen purging to maintain a relative humidity of less than 25%. Nanofibers having a diameter of about 2000 nanometers were collected on the grounding aluminum panel and were characterized by optical microscopy and scanning electron microscopy.

Example 2

The acrylic-silane resin solution from Example A (10 grams) was blended with Ethyl Polysilicate (Silbond® 40, 2 grams), polyvinylpyrrolidone (0.1 grams) and water (1.5 grams). The formulation was stored at room temperature for 3.5 hours. A portion of the formulation was loaded into a 10 ml syringe and delivered via a syringe pump at a rate of 1.6 milliliters per hour to the spinneret of Example 1. The conditions for electrospinning were as described in Example 1. Nanofibers having a diameter of about 400 nanometers were collected on the grounding aluminum panels and were characterized by optical microscopy and scanning electron microscopy.

Example 3

The acrylic-silane resin solution from Example A (10 grams) was blended with Ethyl Polysilicate (Silbond® 40, 0.45 grams), dimethylethanolamine (0.05 grams), polyvinylpyrrolidone (0.1 grams) and water (1.5 grams). The formulation was stored at room temperature for 5.3 hours. A portion of the formulation was loaded into a 10 ml syringe and delivered via a syringe pump at a rate of 1.6 milliliters per hour to the spinneret of Example 1. The conditions for electrospinning were as described in Example 1. Ribbon-shaped nanofibers having a thickness of about 250 to 1500 nanometers and a width of about 200 to 500 nanometers were collected on the grounding aluminum foil and were characterized by optical microscopy and scanning electron microscopy.

Example 4

The acrylic-silane resin solution from Example A (10 grams) was blended with Ethyl Polysilicate (Silbond® 40, 1.01 grams), dimethylethanolamine (0.14 grams), polyvinylpyrrolidone (0.2 grams) and water (1.5 grams). The formulation was stored at room temperature for 45 minutes. A portion of the formulation was loaded into a 10 ml syringe and delivered via a syringe pump at a rate of 1.6 milliliters per hour to the spinneret of Example 1. The conditions for electrospinning were as described in Example 1. Ribbon-shaped nanofibers having a thickness of about 850 to 1100 nanometers and a width of about 300 to 800 nanometers were collected on the grounding aluminum panel and were characterized by optical microscopy and scanning electron microscopy.

Whereas particular embodiments of this invention have been described above for purposes of illustration, it will be evident to those skilled in the art that numerous variations of the details of the present invention may be made without departing from the invention as defined in the appended claims.

What is claimed is:

1. A method of forming a composite fiber having an organic phase and an inorganic phase comprising:
    electrospinning an electrically conductive solution of an organic polymer and an inorganic polymer or a precursor of the inorganic polymer in the presence of an electric field between a spinneret and a ground source to form the composite fiber wherein the organic and inorganic phases of the composite fiber have intermixed and reacted with one another, wherein the organic polymer comprises reactive silane groups and wherein the organic polymer and the inorganic polymer or the recursor of the inorganic polymer contain co-reactive functional groups that react with one another during electrospinning.

2. The method of claim 1 in which the fibers are collected on the ground source.

3. The method of claim 1 in which the fibers have a diameter up to 5000 nanometers.

4. The method of claim 2 in which the organic polymer is a (meth)acrylic polymer or copolymer.

5. The method of claim 2 in which the organic polymer containing silane groups also contains groups selected from carboxyl, hydroxyl and optionally nitrogen-containing groups.

6. The method of claim 1, wherein the organic polymer comprises:
    (a) 0.2 to 20 percent silane groups measured as silicon,
    (b) 1 to 20 percent carboxyl groups,
    (c) 0.5 to 6.5 percent hydroxyl groups, and
    (d) 0.2 to 5.0 percent nitrogen.

7. The method of claim 1, wherein the composite fiber comprises:
    10 to 90 percent by weight organic polymer, and
    10 to 90 percent by weight of inorganic polymer or a precursor of the inorganic polymer, the percentages by weight being based on total fiber weight.

8. The method of claim 1, wherein the electrically conductive solution of the organic polymer and the inorganic polymer or the precursor of the inorganic polymer has a viscosity 1,000 centistokes or less prior to electrospinning.

9. The method of claim 1, wherein the electrically conductive solution of the organic polymer and the inorganic polymer or the precursor of the inorganic polymer has a viscosity 250 centistokes or less prior to electrospinning.

* * * * *